United States Patent
Hohn et al.

(10) Patent No.: US 12,188,122 B2
(45) Date of Patent: Jan. 7, 2025

(54) PROCESS AND DEVICE FOR PROVIDING VAPOR

(71) Applicant: SINGULUS TECHNOLOGIES AG, Kahl am Main (DE)

(72) Inventors: Oliver Hohn, Gründau (DE); Michael Reising, Mömbris (DE); Johannes Grübler, Käbschütztal (DE); Kurt Pietsch, Dresden (DE); Jörg Koch, Dautphetal (DE)

(73) Assignee: SINGULUS TECHNOLOGIES AG, Kahl am Main (DE)

( * ) Notice: Subject to any disclaimer, the term of this patent is extended or adjusted under 35 U.S.C. 154(b) by 520 days.

(21) Appl. No.: 17/252,456

(22) PCT Filed: Mar. 20, 2019

(86) PCT No.: PCT/EP2019/056998
§ 371 (c)(1),
(2) Date: Dec. 15, 2020

(87) PCT Pub. No.: WO2019/242899
PCT Pub. Date: Dec. 26, 2019

(65) Prior Publication Data
US 2021/0189559 A1    Jun. 24, 2021

(30) Foreign Application Priority Data
Jun. 20, 2018 (DE) .................. 10 2018 004 987.7

(51) Int. Cl.
*C23C 16/448* (2006.01)
*B01B 1/00* (2006.01)
*C23C 16/52* (2006.01)
*G05D 23/19* (2006.01)

(52) U.S. Cl.
CPC .......... *C23C 16/4481* (2013.01); *B01B 1/005* (2013.01); *C23C 16/52* (2013.01); *G05D 23/19* (2013.01)

(58) Field of Classification Search
CPC .......................... C23C 16/4481; C23C 16/52
See application file for complete search history.

(56) References Cited

U.S. PATENT DOCUMENTS

| 1,328,593 | A  |   | 1/1920  | Ruths |
|---|---|---|---|---|
| 2006/0222768 | A1 | * | 10/2006 | Faguet ............... C23C 16/4481 |
|  |  |  |  | 427/248.1 |
| 2008/0296791 | A1 | * | 12/2008 | Okabe ................ C23C 16/4481 |
|  |  |  |  | 261/141 |
| 2013/0298833 | A1 | * | 11/2013 | Lai .......................... B05D 1/60 |
|  |  |  |  | 118/726 |

FOREIGN PATENT DOCUMENTS

| DE | 414324 | 5/1925 |
|---|---|---|
| DE | 3007909 | 9/1981 |
| DE | 10 2014 109 194 | 1/2016 |
| EP | 2256406 | 12/2010 |
| GB | 2272751 | 5/1994 |
| WO | 2011/080038 | 7/2011 |
| WO | 2013/022669 | 2/2013 |

OTHER PUBLICATIONS

International Search Report for PCT Application No. PCT/EP2019/056998 mailed Jul. 15, 2019.
International Preliminary Report on Patentability for PCT Application No. PCT/EP2019/056998 mailed Dec. 18, 2020.
Written Opinion for PCT Application No. PCT/EP2019/056998 mailed Jul. 15, 2019.

* cited by examiner

*Primary Examiner* — Kelly M Gambetta
(74) *Attorney, Agent, or Firm* — Branch Partners PLLC; Bruce E. Black

(57) ABSTRACT

The present invention is directed to a method and an apparatus for providing vapor for a discontinuous process.

23 Claims, 1 Drawing Sheet

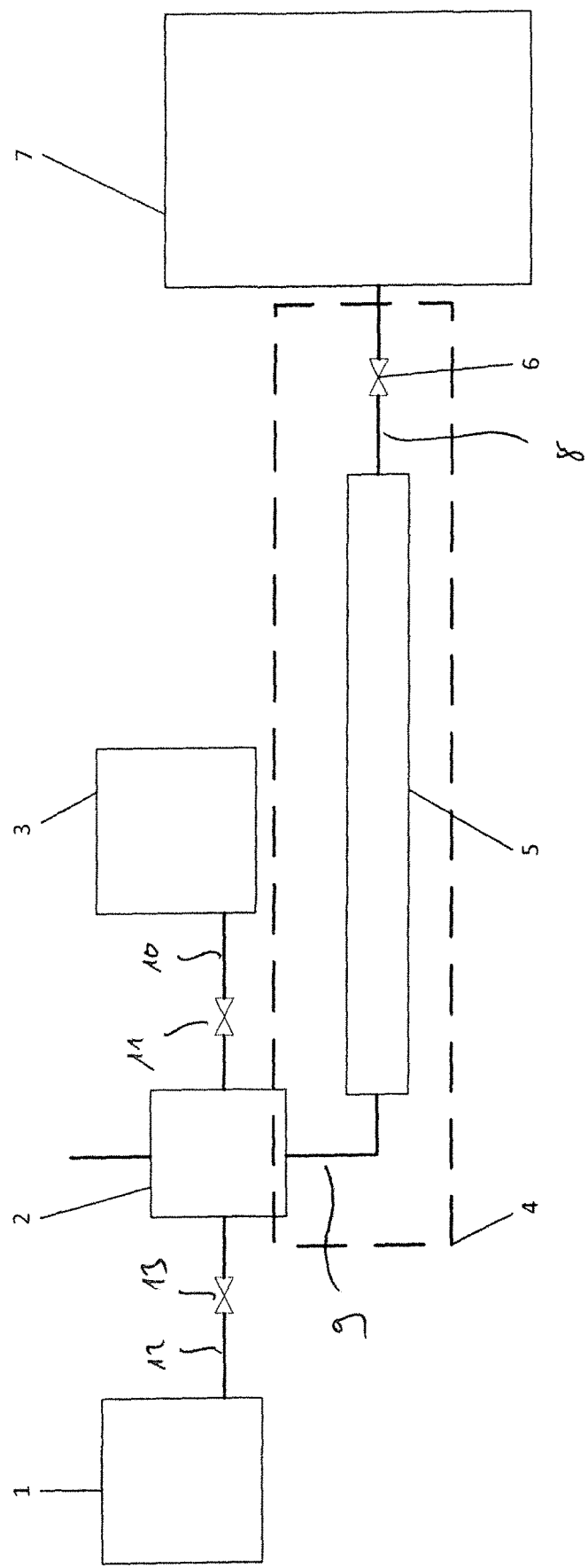

PROCESS AND DEVICE FOR PROVIDING VAPOR

CROSS-REFERENCE TO RELATED APPLICATIONS

This present application is a U.S. national stage application of PCT Application No. PCT/EP2019/056998, filed Mar. 20, 2019, which claims priority to German Patent Application No. 10 2018 004 987.7 filed Jun. 20, 2018, both of which are hereby incorporated by reference in their entirety.

The present invention relates to a method as well as an apparatus for providing vapor for a discontinuous process and a method for filling a process region with vapor.

Vapor with very specific properties is required under well-defined conditions for a plurality of industrial processes. For instance, in the production of semiconductors or solar cells as well as in several coating processes, the required liquids are supplied to the process as vapor in the gaseous phase. In order to generate the required vapor out of the corresponding liquids (e.g., organometallic compounds or mixtures), different methods are known, which are, inter alia, based on the heating of the liquid or based on so-called direct evaporation. With this method, vapor may be generated under well-defined, constant conditions during continuous operation and after a certain settling time. In many industrial processes, however, the need for vapor is discontinuous. The process itself may, e.g., be a clocked process which only requires a periodic supply of vapor. Moreover, a continuous process, which is not operated permanently, comprises discontinuities as well, i.e., when the process is switched on or off. Conventionally, this is counteracted by generating vapor continuously and, in case that no vapor is needed, diverting the vapor via a bypass, as is described, e.g., in WO 2013/022669 A2. However, this will lead to an undesired material loss. Furthermore, it is known from DE 10 2014 109 194 A1 to provide a so-called "modulation device" which, during a vapor supply phase, is temperature-controlled to a first modulation temperature in which the vapor passes through the modulation device without condensing, and, during an interruption phase, is temperature-controlled to a second modulation temperature at which at least part of the vapor condenses. Although the material loss is minimized in this method, the shift from the interruption phase to the vapor supply phase requires a settling process as well since no constant pressure, i.e., no constant vapor flow may be created instantaneously during the heating of the modulation device and evaporation of the condensed vapor.

It is thus an object of the present invention to provide a method as well as an apparatus for providing vapor for a discontinuous or switched process which take into account the problems discussed at the beginning. This object is achieved by a method and/or an apparatus according to the independent claims. The dependent claims are directed to particularly preferred embodiments.

The present invention inter alia relates to a method for providing vapor for a discontinuous or switched process. The method comprises evaporation of a liquid in a direct evaporator for generating a vapor as well as transporting the vapor form the direct evaporator to a process region via a storage volume, wherein the temperature of the storage volume is closed loop controllable. If no vapor is required in the process region, the fluid connection between the storage volume and the process region will be interrupted, wherein vapor will be generated and transported into the storage volume at least temporarily during the interruption, so that the pressure within the storage volume increases during the interruption.

In other words, the present invention is inter alia based on the idea of continuously generating vapor if vapor is needed discontinuously, and of storing the generated vapor in a storage or buffering volume. Since the pressure within the storage volume is maintained or, in the case of further vapor generation, even increases during the interruption, vapor having the required, well-defined properties may instantaneously be provided by the process if there is a need for vapor again. Since the storage volume is located between the direct evaporator and the process region, no material loss occurs during the interruption of the vapor supply. Furthermore, the interruption of the fluid connection and its restoration during the method according to the invention may be closed loop controlled much faster and more flexible than is possible, e.g., with the modulation device of DE 10 2014 109 194 A1.

The method according to the invention is generally applicable with the evaporation of arbitrary liquids and, in particular, also with the evaporation of organometallic compounds or mixtures. Preferably, the liquid to be evaporated is a liquid precursor for the photovoltaics industry and/or semiconductor industry, e.g., such as water and/or organometallic compounds, particularly trimethylaluminum (TMAl), triethylaluminum (TEAl), trimethylgallium (TMGa), triethylgallium (TEGa), dimethylzinc (DMZn) and diethylzinc (DEZn). In this context, both the evaporation of pure materials and material mixtures is possible. Typical evaporation rates lie within a range from a few milligrams per minute up to a few grams per minute but are not limited thereto.

The transport of the vapor from the direct evaporator via the storage volume to the process region may, e.g., take place by means of a carrier gas or due to a pressure drop between the direct evaporator and the process region.

The storage, buffering or supply volume may constitute a separate unit which is connected by corresponding fluid connections or conduits to the direct evaporator on the one hand and the process region on the other hand. The storage volume may, however, also be formed by a correspondingly dimensioned conduit between the direct evaporator and the process region. In this context, the following preferably applies for the storage volume $V_{storage}$, the temperature-dependent vapor pressure $p_{vap}(T)$ of the liquid to be evaporated, the temperature T of the storage volume, the mass flow Q at the direct evaporator and the initial pressure $p_0$ in the direct evaporator prior to the interruption of the fluid connection at a maximum duration dt of the interruption: $V_{storage} > (Q \times dt)/(p_{vap}(T) - p_0)$.

It is further preferred that the storage volume comprises a minimum cross-sectional area of at least 25 mm$^2$, preferably at least 30 mm$^2$, further preferably at least 35 mm$^2$, and particularly preferably at least 40 mm$^2$. In case fluid connections are provided between the direct evaporator and the storage volume and/or between the storage volume and the process region, said fluid connections preferably have the same minimum cross-sectional areas.

Before evaporation begins, the pressure within the storage volume is preferably smaller than the vapor pressure of the liquid to be evaporated; preferably, the pressure is smaller than 20 mbar and, particularly preferably, smaller than 10 mbar.

Preferably, the interruption of the fluid connection between the storage volume and the process region only takes place within a period during which no more liquid is evaporated than can be stored in the storage volume. Preferably, the fluid connection between the storage volume and the process region is interrupted for a maximum of 180 seconds, preferably for a maximum of 150 seconds, further preferably for a maximum of 120 seconds, even further preferably for a maximum of 90 seconds, even further preferably for a maximum of 60 seconds. It is particularly preferred that the period of interruption is shorter than 30 seconds, preferably shorter than 20 seconds, further preferably shorter than 15 seconds, even further preferably shorter than 10 seconds and particularly preferably shorter than 5 seconds.

The interruption of the fluid connection between the storage volume and the process region as well as its restoration take place preferably automatically. For this purpose, for instance, a corresponding closed loop control mechanism may be supplied with the required information from the process region. In this way, for instance, the process region may send a signal to the closed loop control mechanism as soon as vapor is required or as soon as no more vapor is required.

The temperature of the storage volume is closed loop controlled preferably during the interruption. Particularly preferably, the storage volume is heated during the interruption. The closed loop control of the temperature of the storage volume may, however, also comprise active cooling. In this context, the temperature closed loop control takes place such that the temperature of the storage volume during the interruption is preferably at least high enough that no condensation of the vapor occurs within the storage volume. In this way, the closed loop control stability and the response time of the method according to the invention are improved. In this context, the temperature of the storage volume should be lower than the decomposition temperature of the evaporated liquid. In order to closed loop control the temperature, the storage volume is preferably provided with one or a plurality of heating elements. Suitable heating elements comprise, e.g., heating bands, heating hoses, heating cartridges or heating sleeves. Heating sleeves consist of heating wires, insulation and thermocouple elements. Alternatively, fluid heat transfer media may also be used in order to heat the storage volume and other component parts. Alternatively or additionally, the storage volume may also be heated by means of radiation. Accordingly, the heating element may also comprise an emitter for radiation, preferably for infrared radiation.

Preferably, a plurality of heating circuits is used for temperature closed loop control. It is further preferred that the temperature of the storage volume is closed loop controlled between the interruptions as well. If a separate element which is connected with the direct evaporator and/or the process region by a conduit is provided as a storage volume, the temperature of the conduit between the direct evaporator and the storage volume and/or the temperature of the conduit between the storage volume and the process region is preferably closed loop controlled during the interruption as well, particularly preferably continuously. For this purpose, additional heating elements may be provided at the corresponding conduits.

According to the invention, vapor continues to be generated and transported into the storage volume at least temporarily during the interruption of the fluid connection between the storage volume and the process region. It is preferred that vapor continues to be generated and transported into the storage volume at least during 30%, preferably at least during 50%, further preferably at least during 70% and particularly preferably at least during 90% of the interruption period. During this period, vapor is generated preferably continuously. Particularly preferably, vapor continues to be generated and transported into the storage volume continuously during the complete interruption period, preferably at a constant rate. During the interruption, the pressure within the storage volume increases preferably by at least 5%, preferably by at least 10%, further preferably by at least 20%, even further preferably by at least 35%, and particularly preferably by at least 50%.

Preferably, the fluid connections between the storage volume and the process region are restored as soon as vapor is needed within the process region. Preferably, the restoration of the fluid connections takes place automatically and may be triggered by, e.g., a corresponding signal from the process region. If the process is a clocked process, the interruption and restoration of the fluid connection may also take place automatically with the help of a predetermined time pattern. Preferably, the interruption and/or restoration of the fluid connection between the storage volume and the process region takes place by means of an automatically closed loop controlled valve. Valves that are suitable for this purpose are, for instance: membrane valves, ALD valves or bellow-seal valves.

Preferably, the discontinuous or switched process is a clocked process, so that vapor is alternatingly required or not required within the process region. In this case, it is preferred that the interruption and restoration of the fluid connections between the storage volume and the process region are clocked as well. In doing so, vapor continues to be generated and transported into the storage volume preferably continuously during the complete process, preferably at a constant rate.

As already mentioned above, the transport of the vapor may take place from the direct evaporator to the process region via the storage volume by means of a pressure gradient. Preferably, the vapor is transported by means of a carrier gas from the direct evaporator to the process region via the storage volume. In this case, it is preferred that the supply of carrier gas is interrupted as long as the fluid connection between the storage volume and the process region is interrupted. For instance, suitable carrier gases are inert gases which do not react with the vapor, particularly $N_2$, Ar, $H_2$, or gas mixtures thereof.

As already mentioned above, the method for providing vapor according to the invention is suitable for arbitrary discontinuous or switched processes and, in particular, for clocked processes. An important field of application for the method according to the invention is the (initial) filling of a process region with vapor since the start of an otherwise continuous process also constitutes a discontinuity. Accordingly, the present invention is also directed to a method for filling a process region with vapor from a direct evaporator which is connected to the process region via a storage volume and a fluid connection. The method comprises the evaporation of a liquid in the direct evaporator in order to generate vapor while the fluid connection between the storage volume and the process region is interrupted. Evaporation continues until a predetermined filling condition is met. After that, the fluid connection between the storage volume and the process region is restored and the process region is filled with vapor.

With this method, vapor may be introduced into the process region particularly quickly under predetermined conditions.

Preferably, the predetermined filling condition comprises one or a combination of the following conditions: reaching a predetermined, preferably constant evaporation rate; reaching a predetermined pressure and/or vapor volume in the storage volume.

Prior to the start of evaporation, the pressure within the storage volume is preferably smaller than the vapor pressure of the liquid.

It is further preferred that the storage volume is heated during evaporation.

It is evident to the person skilled in the art that the preferred features described above with respect to the method for providing vapor for a discontinuous process may analogously be applied to the method for filling a process region with vapor from a direct evaporator according to the invention as well.

It is preferred that the process region is part of a coating machine, preferably of a vacuum coating machine. Preferably, the process region is part of a coating machine for CVD, PE-CVD, epitaxy, MO-CVD and/or MOVPE by means of which, inter alia, thin layers of different materials (such as, e.g., metallic, dielectric, semiconductive and/or organic materials) may be produced.

The present invention is further directed to an apparatus for providing vapor for a discontinuous or switched process. The apparatus comprises a direct evaporator for generating a vapor, a storage volume in fluid connection with the direct evaporator, and a temperature closed loop control by means of which the temperature of the storage volume may be closed loop controlled. The apparatus further comprises a conduit by means of which the storage volume may be connected with a process region. The conduit comprises a valve. The apparatus further comprises a control unit which is suitable and configured for controlling the direct evaporator and the valve such that the valve is open and the generated vapor is transported from the direct evaporator to the process region via the storage volume if vapor is required in the process region, that the valve is closed if no vapor is required in the process region, and that vapor continues to be generated at least temporarily during the interruption so that the pressure within the storage volume increases during the interruption.

Preferably, the control unit is suitable and configured for controlling the temperature closed loop control such that the temperature of the storage volume is closed loop controlled during the interruption. The control unit is further preferably suitable and configured for controlling the temperature closed loop control such that during the interruption the temperature of the storage volume is at least so high that no condensation of the vapor occurs within the storage volume.

Preferably during the complete time of interruption, vapor continues to be generated and transported into the storage volume, preferably at a constant rate.

Preferably, the apparatus further comprises a conduit for supplying a carrier gas, which conduit may be interrupted by means of an additional valve. The control unit is further preferably suitable and configured for closing the additional valve as long as the fluid connection between the storage volume and the process region is interrupted. The flow of the carrier gas varies in a range of 0 to 5 SLM.

The storage volume and/or the conduit by means of which the storage volume may be connected with a process region comprises an inner cross-sectional area of at least 25 mm$^2$, preferably of at least 30 mm$^2$, further preferably of at least 35 mm$^2$, and particularly preferably of at least 40 mm$^2$.

Preferably, the apparatus is suitable for carrying out the above-described method with its preferred features.

The present invention is further directed to a coating machine, preferably a vacuum coating machine, for coating a substrate. The coating machine comprises a process region as well as an apparatus as described above, the conduit of the apparatus being connected with the process region. Preferably, it is a coating machine for CVD, PE-CVD, epitaxy, MO-CVD and/or MOVPE by means of which, inter alia, thin layers of different materials (such as, e.g., metallic, dielectric, semiconductive and/or organic materials) may be produced.

The process region preferably comprises a process chamber with a chamber volume $V_K$. For the partial pressure $p_p$ of the liquid to be evaporated in the process chamber, the storage volume $V_s$ and the maximum pressure in the storage volume $p_{max}$, it is preferred that the ratio is $(V_K*p_p)/(V_S*p_{max})<20$, preferably $<10$, further preferably $<5$, even further preferably $<2$, and particularly preferably $<0.75$.

The methods according to the invention as well as the apparatuses according to the invention are advantageous over the prior art for different reasons. Compared to conventional solutions with bypasses, there is no loss of material with the solution according to the invention. Moreover, evaporation may be operated in a very stable manner and there is no settling phase during abrupt switch-on. When the stored gas is abruptly introduced from the storage volume into the process region, the additional amount of gas from the storage volume shortens the time that is required until stable pressure conditions have been set in the entire system. Thus, the process may be started earlier since no waiting time is required in order to set a stable, constant evaporation rate. Preferred embodiments of the solution according to the invention involve one or a plurality of the following advantages: providing vapor for discontinuous processes; quick switch-on and/or switch-off of the vapor supply into the process region; quick filling of the process chamber despite continuous evaporation; improved utilization of the liquid; no material loss; shortened period of time until a stable state is reached in the process; shortened time for setting a stable gas composition, i.e., a stable pressure in the process chamber; shortened waiting time until the process starts; higher output during clocked deposition; maximum service life is not limited by evaporation since liquid may be supplied continuously at low temperatures; evaporation rate is not temperature or pressure sensitive; scaling is possible for arbitrary evaporation rates; adaption to process chamber and gas supply system is possible; operation is possible with/without carrier gas; apparatus and/or method may be used for liquids and mixtures of different thermal properties.

In the following, a preferred embodiment of the present invention is described with reference to the Figures. in which FIG. 1 shows an apparatus for providing vapor for a discontinuous process according to a preferred embodiment.

FIG. 1 schematically shows an apparatus for providing vapor for a discontinuous process according to a preferred embodiment. The discontinuous process is carried out in the process region 7 (illustrated as well), which does not form part of the apparatus according to the invention. The apparatus comprises a direct evaporator 2 for generating a vapor from liquid which is provided to the direct evaporator 2 from a liquid metering device 1 via the conduit 12. The conduit 12 may be closed and opened by the valve 13. The apparatus further comprises a storage volume 5 in fluid communication with the direct evaporator 2 via a conduit 9. The temperature of the storage volume 5 may be closed loop controlled by the closed loop temperature control 4. The apparatus further comprises a conduit 8 by means of which the storage volume 5 may be connected with the process region 7, wherein a valve 6 is provided in the conduit 8. The apparatus further comprises a non-illustrated control unit which is suitable and configured for controlling the direct evaporator 2 and the valve 6 such that the valve 6 is open and the generated vapor is transported from the direct evaporator 2 to the process region 7 via the storage volume 5 if no vapor is required in the process region 7, and that vapor continues to be generated at least temporarily during the interruption so that the pressure within the storage volume 5 increases during the interruption.

In the embodiment shown in FIG. 1, the temperature closed loop control 4, which preferably comprises one or a plurality of heating elements, is configured such that not only the temperature of the storage volume 5 but also the temperature of the conduit 9 between the direct evaporator 2 and the storage volume 5 as well as of the conduit 8 between the storage volume 5 and the process region 7 may be closed loop controlled. In this way, it may be made sure that no vapor condensates in the complete area between the direct evaporator 2 and the process region 7.

In the illustrated preferred embodiment, the vapor is transported from the direct evaporator to the process region 7 via the storage volume 5 by a carrier gas. For this purpose, the apparatus comprises a conduit 10 for supplying a carrier gas, said conduit being interruptible by an additional valve 11. The volume flow of the carrier gas is preferably closed loop controlled by the constant flow controller 3.

Preferably, the non-illustrated control unit is also suitable and configured for closing the additional valve 11 as long as the fluid connection 8 between the storage volume 5 and the process region 7 is interrupted. It is further preferred that the control unit controls the liquid metering device 1 and/or the valve 13 in the conduit 12 and/or the constant flow controller 3 as well.

For instance, the liquid metering 1 may be carried out with the help of a mass flow controller for liquids, which uses thermal, Coriolis and/or ultrasonic measuring methods. Alternatively, a combination of a mass flow meter and a closed loop control valve or a dosing system and a dosing pump (e.g., micro annular gear pump, plunger pump, membrane pump) may be used. In the direct evaporator, the entire evaporation of the supplied liquid takes place by energy supply and temperature closed loop control. The closed loop control valve of the liquid metering device 1 may also be integrated into the direct evaporator 2 or into the conduit 12 (e.g., in the form of the valve 13 or as an additional closed loop control valve). Furthermore, the liquid metering device 1 and the direct evaporator 2, which are illustrated as separate units in FIG. 1, may also form a joint unit.

However, the invention is not limited to the arrangements shown in FIG. 1 or described above. Rather, other methods for metering and direct evaporation that are known to the skilled person may also be used.

The invention claimed is:

1. A method for providing vapor for a discontinuous process, the method comprising:
    flowing a liquid into a direct evaporator using a liquid metering device;
    evaporating the flowing liquid in the direct evaporator to generate a vapor;
    transporting the vapor from the direct evaporator to a process region via a storage volume, wherein a temperature of the storage volume is closed loop controllable;
    wherein a fluid connection between the storage volume and the process region is interrupted when no vapor is required in the process region, and wherein vapor continues to be generated and transported into the storage volume at least temporarily during the interruption so that a pressure within the storage volume increases during the interruption, wherein $V_{storage} > (Q \times dt)/(p_{vap}(T) - p_0)$, wherein Q is a mass flow at the direct evaporator, dt is a maximum duration of the interruption, $p_{vap}(T)$ is a temperature-dependent vapor pressure of the flowing liquid, and $p_0$ is an initial pressure in the direct evaporator prior to the interruption.

2. The method according to claim 1, wherein the temperature of the storage volume is closed loop controlled during the interruption, wherein the storage volume is heated during the interruption.

3. The method according to claim 1, wherein the temperature of the storage volume is at least so high that during the interruption no condensation of the vapor occurs within the storage volume.

4. The method according to claim 1, wherein vapor continues to be generated and transported into the storage volume continuously during a complete period of the interruption.

5. The method according to claim 1, wherein the fluid connection between the storage volume and the process region is restored as soon as vapor is required in the process region.

6. The method according to claim 1, wherein the interruption and/or a restoration of the fluid connection between the storage volume and the process region takes place by means of an automatically closed loop controlled valve.

7. The method according to claim 1, wherein the discontinuous process is a clocked process so that vapor is alternatingly required or not required within the process region, wherein the interruption and a restoration of the fluid connection between the storage volume and the process region is clocked as well and wherein vapor continues to be generated and transported into the storage volume continuously during the complete process.

8. The method according to claim 1, wherein the vapor is transported from the direct evaporator to the process region via the storage volume using a carrier gas, wherein a supply of the carrier gas is interrupted as long as the fluid connection between the storage volume and the process region is interrupted.

9. A method for filling a process region with vapor from a direct evaporator that is connected with the process region via a storage volume and a fluid connection, wherein the method comprises:
    flowing a liquid into a direct evaporator using a liquid metering device;
    evaporating the flowing liquid in the direct evaporator to generate the vapor while the fluid connection between the storage volume and the process region is interrupted until a predetermined filling condition is met, wherein $V_{storage} > (Q \times dt)/(p_{vap}(T) - p_0)$, wherein Q is a mass flow at the direct evaporator, dt is a maximum duration of the interruption, $p_{vap}(T)$ is a temperature-dependent vapor pressure of the flowing liquid, and $p_0$ is an initial pressure in the direct evaporator prior to the interruption;
    restoring the fluid connection between the storage volume and the process region; and
    filling the process region with vapor.

10. The method according to claim 9, wherein the predetermined filling condition comprises one or a combination of the following conditions: reaching a predetermined evaporation rate; reaching a predetermined pressure and/or vapor volume in the storage volume.

11. The method according to claim 9, wherein a pressure in the storage volume is smaller than a vapor pressure of the liquid before evaporation begins.

12. The method according to claim 9, wherein the storage volume is heated during evaporation.

13. The method according to claim 9, wherein the process region is part of a coating machine.

14. The method according to claim 1, further comprising providing an apparatus, the apparatus comprising:
    the direct evaporator;
    the storage volume in fluid connection with the direct evaporator;
    a temperature closed loop control configured for controlling the temperature of the storage volume;
    a conduit configured for connecting the storage volume with the process region, wherein the conduit comprises a valve; and
    a control unit configured for controlling the direct evaporator and the valve such that:
        the valve is open and the generated vapor is transported from the direct evaporator to the process region via the storage volume when vapor is required in the process region,
        the valve is closed when no vapor is required in the process region, and
        the vapor continues to be generated at least temporarily during the interruption so that the pressure within the storage volume increases during the interruption.

15. The method according to claim 14, wherein the control unit is further configured for controlling the temperature closed loop control such that the temperature of the storage volume is closed loop controlled during the interruption.

16. The method according to claim 14, wherein the control unit is further configured for controlling the temperature closed loop control such that the temperature of the storage volume is at least so high during the interruption that no condensation of the vapor takes place within the storage volume during the interruption.

17. The method according to claim 14, wherein the apparatus is configured so that the vapor continues to be generated and transported into the storage volume continuously during the complete interruption.

18. The method according to claim 14, wherein the apparatus further comprises an additional conduit for supplying a carrier gas, the additional conduit being interruptible using an additional valve, wherein the control unit is further configured for closing the additional valve as long as the fluid connection between the storage volume and the process region is interrupted.

19. The method according to claim 14, wherein the storage volume and/or the conduit comprises an inner cross-sectional area of at least 25 mm$^2$.

20. The method according to claim 14, wherein the apparatus is a coating machine and the coating machine comprises the process region.

21. The method according to claim 3, wherein the vapor is transported from the direct evaporator to the process region via the storage volume, without any interruption, when vapor is required in the process region.

22. The method according to claim 8, wherein the vapor is transported from the direct evaporator to the process region via the storage volume, without any interruption, when vapor is required in the process region.

23. A method for filling a process region with vapor from a direct evaporator that is connected with the process region via a storage volume and a fluid connection, wherein the method comprises:
    flowing a liquid into a direct evaporator using a liquid metering device;
    evaporating the flowing liquid in the direct evaporator to generate the vapor while the fluid connection between the storage volume and the process region is interrupted until a predetermined filling condition is met, wherein $(V_K * p_p)/(V_{storage} * p_{max}) < 20$, wherein $V_K$ is a volume of the process region, $p_p$ is a partial pressure of the flowing liquid in the process region, and $p_{max}$ is a maximum pressure in the storage volume;
    restoring the fluid connection between the storage volume and the process region; and
    filling the process region with vapor.

* * * * *